United States Patent
Ohmura et al.

(10) Patent No.: US 6,956,200 B2
(45) Date of Patent: Oct. 18, 2005

(54) PHASE-SHIFT PHOTOELECTRIC ENCODER

(75) Inventors: Yoichi Ohmura, Tokyo (JP); Toru Oka, Tokyo (JP); Hajime Nakajima, Tokyo (JP); Hirokazu Sakuma, Tokyo (JP); Takashi Okamuro, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/765,861

(22) Filed: Jan. 29, 2004

(65) Prior Publication Data
US 2004/0183000 A1 Sep. 23, 2004

(30) Foreign Application Priority Data
Jan. 31, 2003 (JP) ........................................ 2003-023232

(51) Int. Cl.$^7$ ................................................. G01D 5/34
(52) U.S. Cl. .............................. 250/231.16; 250/214.1; 341/11
(58) Field of Search ....................... 250/231.16, 231.13, 250/231.14, 231.15, 231.17, 231.18, 237 G, 214.1, 559.29; 341/11, 13, 31; 356/614, 616, 617

(56) References Cited

U.S. PATENT DOCUMENTS

| | | | |
|---|---|---|---|
| 5,750,984 A | | 5/1998 | Ieki |
| 5,981,942 A | * | 11/1999 | Ieki ...................... 250/231.16 |
| 6,410,911 B1 | * | 6/2002 | Omi ...................... 250/231.13 |
| 6,610,975 B2 | | 8/2003 | Ito et al. |
| 6,794,637 B1 | * | 9/2004 | Holzapfel et al. ...... 250/231.13 |
| 2002/0018220 A1 | * | 2/2002 | Aoki ......................... 356/614 |

FOREIGN PATENT DOCUMENTS

| | | |
|---|---|---|
| JP | 8-201117 | 8/1996 |
| JP | 2002-236033 | 8/2002 |

* cited by examiner

Primary Examiner—David Porta
Assistant Examiner—Seung C. Sohn
(74) Attorney, Agent, or Firm—Leydig, Voit & Mayer, Ltd.

(57) ABSTRACT

A scale generates a periodic light-intensity distribution pattern having a pitch upon irradiation by emission light from a light source. Light-detecting element groups are shifted relative to the scale to generate phase signals having fixed phase differences. Light-detecting elements are adjacently positioned to have the same phase to form each light-detecting element group. Area centers of gravity on a phase axis of the light-detecting element groups having a fixed phase difference are made coincident with each other.

14 Claims, 5 Drawing Sheets

PHASE-SHIFT PHOTOELECTRIC ENCODER

BACKGROUND OF THE INVENTION

1. Field of the Invention

The present invention generally relates to a photoelectric encoder, and more particularly, relates to a photoelectric encoder employing a shifting encoder scale, which is used for measurement of position and for detecting movement amount of a moving object in various machine tools, semiconductor manufacturing devices, and the like.

2. Description of the Related Art

In a conventional photoelectric encoder, light-detecting elements are arranged to have different four phases, i.e., A phase, B phase, /A phase and /B phase with a phase difference of P/4 with respect to an input signal pitch P, and each of the light-detecting elements has a width of P/2. The light-detecting elements are arranged in parallel with respect to a movement direction of a shifting scale, and four light-detecting elements having respectively different phases are combined into one set and a plurality of sets of the light-detecting elements are arranged in the movement direction of the shifting scale, so that a shift amount of the shifting scale is detected. Thus, a movement amount or a relative position of a moving object is detected, as corresponding to the shift amount of the scale. In this arrangement, a light source is positioned on a side opposite to the scale side, and duty ratio of the scale is set to 50%. See, for example, Paragraph 0008, FIG. 2 of Patent Document 1: Japanese Patent Laid-open Publication No. 8-201117.

In another conventional example of a photoelectric encoder, light-detecting elements are specified for A phase, B phase, /A phase and /B phase, each having a phase difference of P/4 with respect to an input signal pitch P, and the light-detecting elements are arranged with an interval of 3P/4 with respect to a scale shifting direction, so that a shift amount (i.e., movement amount) of the scale is detected. See, for example, Paragraphs 0067 to 0069, FIG. 10 of Patent Document 2: Japanese Patent Laid-open Publication No. 2002-236033.

It is noted here that the term "pitch P" is an interval of respective light-transmitting slits that are formed in the scale, and the pitch P corresponds to a cycle of an input signal obtained through the scale. Moreover, in the description of the present specification, with respect to the terms "A phase", "B phase", "/A phase" and "/B phase", it is noted that "/A phase" and "/B phase" represents complementary relationships of inversion differential signals (with a phase difference of 180 degrees) with respect to "A phase" and "B phase", respectively.

However, in the above-mentioned conventional photoelectric encoder, since the pitch is too narrow, it is not possible to provide a space for forming a cross-talk preventive portion, resulting in disadvantages such that a light signal deflects and reach the light-detecting elements and that a cross-talk may be undesirably generated between adjacent light-detecting elements. For preventing such s cross-talk, there may be considered a method in which the width of each light-detecting element is made smaller than P/2. However, if the width of the light-detecting element is reduced, the signal output thereof is undesirably reduced.

Moreover, the conventional photoelectric encoder has a complex wiring structure with wires mutually overlapping at some places, and therefore manufacturing of a light-detecting element array is made difficult.

SUMMARY OF THE INVENTION

The present invention has been devised to solve the above-mentioned problems, and its objective is to provide a photoelectric encoder that ensures a space used for accommodating a cross-talk preventive means between respective adjacent light-receiving elements, to thereby prevent the light signal components applied to the spaces from running around the light-receiving elements, thereby preventing occurrence of cross-talk.

Another objective is to reduce cross-talk between adjacent wirings by eliminating overlapping of the wirings and to easily manufacture a light-receiving element array.

Still another objective is to provide a photoelectric encoder which can carry out a stable differential amplification without having any influence from variations in light emission-angle of the light source, so that a phase error due to an emission-angle error can be reduced when the differential amplification is carried out.

In order to achieve the above-mentioned objectives, a photoelectric encoder in accordance with the present invention includes a scale which generate a periodical light-intensity distribution pattern having a predetermined pitch P when the scale is irradiated by a light source.

The encoder further includes a plurality of light-receiving segment groups that are shifted relative to the scale to generate phase signals having predetermined phase differences so that the movement amount is detected based on the phase signals with the predetermined phase differences. In this construction, a plurality of light receiving elements having the same phase are adjacently arranged to form each of the light-receiving segment groups, and thus the plurality of the light-receiving segment groups are arranged in parallel.

In this manner, the light-receiving elements having the same phase are arranged adjacent to each other as one set of the light-receiving elements, and plural sets thereof form a plurality of light-receiving segment groups which are arranged in parallel. Thus, it is possible to maintain a space for providing a cross-talk preventive member between the respective adjacent light-receiving elements even when the pitch thereof is comparatively small. Thus, it becomes possible to prevent components of an incident light signal applied to the spaces from running around the light-receiving elements and to reduce the cross-talk. Moreover, it becomes possible to eliminate overlapping wirings, and consequently to easily manufacture a light-receiving elements array.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DESCRIPTION OF THE PREFERRED EMBODIMENTS

Figure 1:
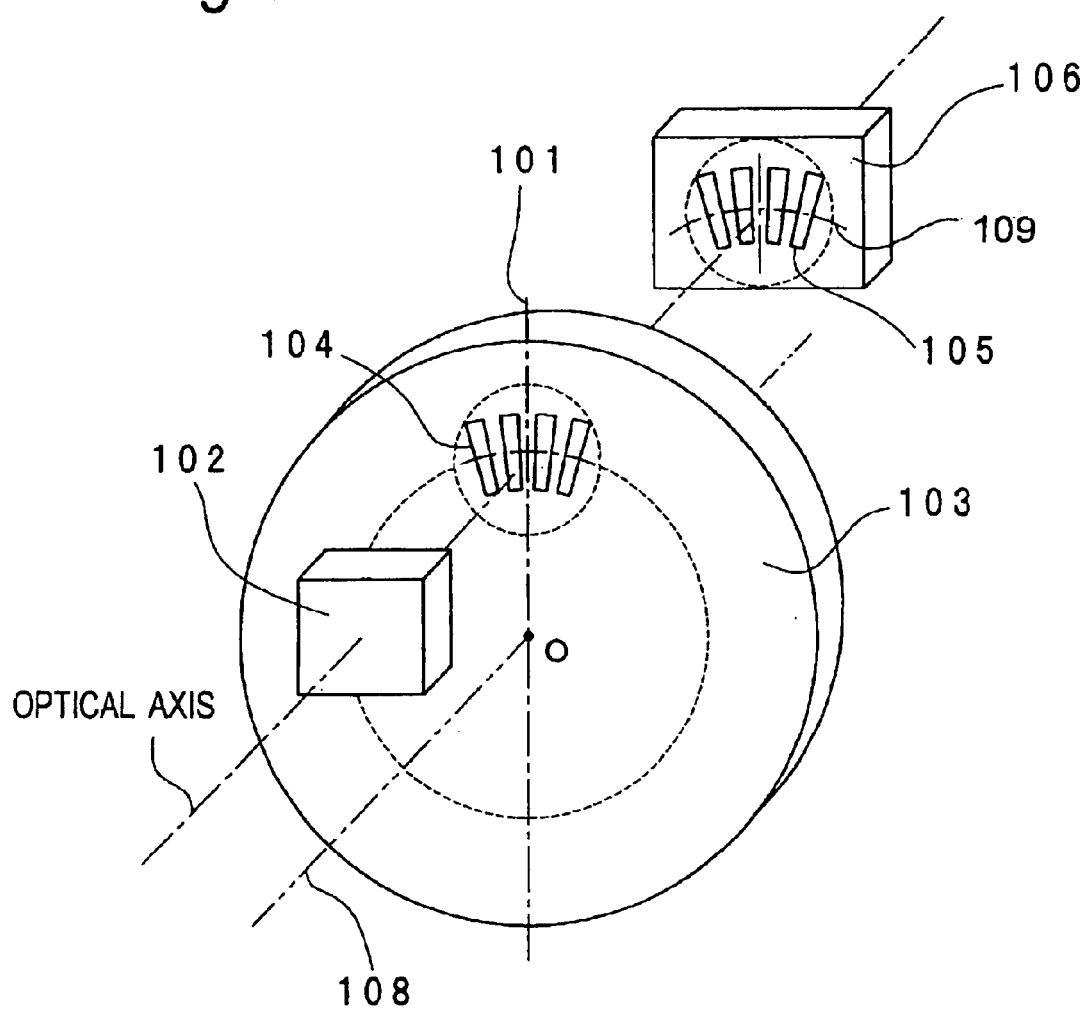
FIG. 1 is a perspective view showing a schematic structure of main parts of a photoelectric encoder according to an embodiment 1 of the present invention.

Before the description proceeds, it is to be noted that, since the basic structures of the preferred embodiments are in common, like parts are designated by the same reference numerals throughout the accompanying drawings.

(Embodiment 1)

Figure 2:
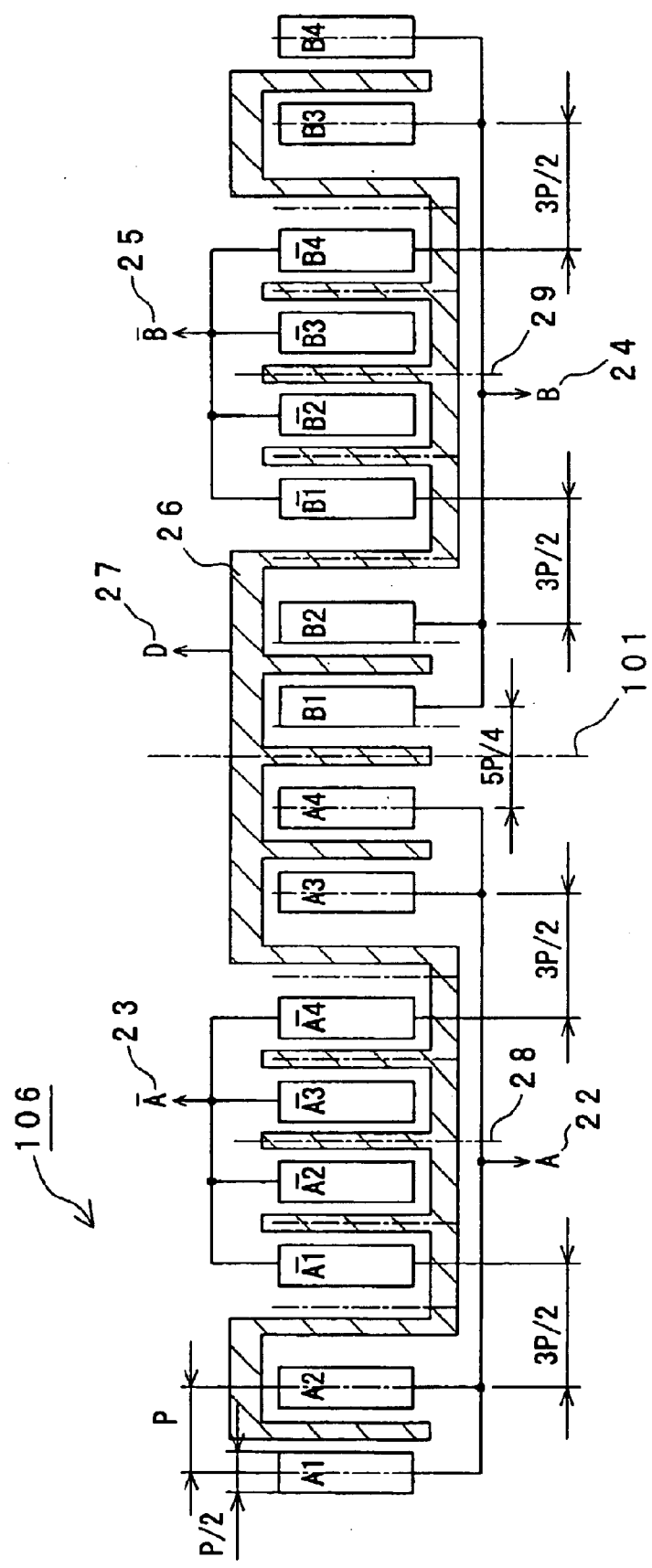
FIG. 2 is an enlarged view of a light-detecting element array arranging light-detecting elements of the photoelectric encoder shown in FIG. 1.

Referring to FIGS. 1 and 2, the following describes an embodiment 1 of the present invention. FIG. 1 shows a schematic structure of a photoelectric encoder in accordance with the embodiment 1 of the present invention. FIG. 2 is an enlarged view of a light-receiving element array in which a plurality of sets of light-receiving elements are arranged on phase basis.

In FIG. 1, reference numeral 102 represents a light source such as an LED and the like, which emits light that is applied to a rotary scale 104. Reference numeral 103 is a rotary body that rotates around a rotary axis 108. The rotary body 103 may be formed of a disc-shaped rotary plate which is rotated in accordance with a movement of a moving object (not shown).

The rotary scale 104 has an configuration such that a plurality of light transmitting slits are formed in a radial manner. More specifically, the plural slits are formed in the rotary body 103 and arranged in a concentric radial manner around the rotary axis 108 of the rotary body 103. Moreover, the rotary scale 104 is formed to have an irradiation pattern with a center axis line 101 thereof which is perpendicular to the optical axis. The center axis line 101 is passing through the rotational center O of the rotary body 103. The irradiation pattern of the rotary scale 104 has a pitch P, with a duty ratio of 50%. The pitch P is an interval of respective light-transmitting slits formed in the scale, and the pitch P corresponds to a cycle of an incident light signal obtained through the rotary scale.

Reference numeral 106 denotes a light-receiving element array in which a plurality of light-receiving elements 105 such as photodiodes that receive the transmitted light from the rotary scale 104 and photo-electrically convert the received light. The light-receiving elements 105 are arranged so that the irradiation pattern of the rotary scale having the pitch P is applied onto the light-receiving array 106. In this configuration, the center axis line 101 of the scale irradiation pattern is made coincident with a center axis line of the light-receiving element array 106, which is also represented by reference numeral 101 shown in FIGS. 2 and 3 to be described later.

In the configuration of the light-receiving element array 106 shown in FIG. 2, sixteen pieces of the light-receiving elements in total number are provided and divided into four groups, where the light-receiving elements may be referred to as "light-receiving segments" and each group is referred to as "light-receiving element group" or "light-receiving segment group" in the description, and each of the light-receiving elements has a width of approximately P/2,. The four groups are A phase group, B phase group, /A phase group and /B phase group. The A phase group consists of the light-receiving elements A1–A4, B phase group consists of the light-receiving elements B1–B4, /A phase group consists of the light-receiving elements /A1–/A4, and /B phase group consists of the light-receiving elements /B1–/B4 and these four groups are associated with four different phase signals of A phase (22), B phase (24), /A phase (23) and /B phase (25) to be detected. For example, the A phase (22) is used as a reference phase, B phase (24) has a phase difference of 90 degrees from the reference A phase, /A phase (23) has a phase difference of 180 degrees from the reference A phase and /B phase (25) has a phase difference of 270 degrees from the reference A phase.

Regarding a layout in positioning of the respective light-receiving elements, firstly in associated with the A phase (22), the first light-receiving element A1 is positioned, and the second light-receiving element A2 is arranged at a position with a distance of the pitch P from the light-receiving element A1 for providing the A phase group. Next, for providing the /A phase group associated with the /A phase (23), the light-receiving element /A1 is arranged at a position with a distance of 3P/2 from the light-receiving element A2. Subsequently, the light-receiving elements /A2, /A3 and /A4 for the /A phase are successively arranged at every distance of the pitch P. It is noted here that the term "distance" between the adjacent two light-receiving elements represents a center distance between the center lines of the adjacent two light-receiving elements.

Next, the third light-receiving element A3 for the A phase is arranged at a position with a distance of 3P/2 from the light-receiving element /A4, and the fourth light-receiving element A4 for the A phase is further arranged with a distance of P from the element A3.

In the same manner, the first light-receiving element B1 for the B phase is arranged at a position with a distance of 5P/4 from the element A4, and the second light-receiving element B2 for the B phase is arranged with a distance P from the element B1.

Next, for the /B phase, the light-receiving element /B1 is arranged at a position with a distance of 3P/2 from the light-receiving element B2, and the subsequent light-receiving elements /B2, /B3 and /B4 are successively arranged at every distance P.

Further, the third light-receiving element B3 for the B phase is arranged at a position with a distance of 3P/2 from the element /B4, and the fourth light-receiving element B4 for the B phase is arranged with a distance P from the element B3. Thus, a set of four light receiving elements are positioned to have the same phase to form one light-receiving element group in which at least two light receiving elements are adjacently arranged.

In the configuration shown in FIG. 2, reference numeral 28 represents a common area center of gravity on the phase axis 109 of the respective light-receiving element groups of the A phase group and /A phase group. Reference numeral 29 represents a common area center of gravity on the phase axis of the respective light-receiving element groups of the B phase group and /B phase group. Moreover, the light-receiving element groups are arranged so that the phase distance from the center axis line 101 of the irradiation pattern to the area center of gravity 28 on the phase axis 109 is made equal to the phase distance from the center axis line 101 to the area center of gravity 29. In other words, the area centers 28 and 29 of gravity on the phase axis of the respective light-receiving element groups for the A phase and B phase are arranged symmetrically with respect to the center axis line 101 of the irradiation pattern.

Thus, the 16 light-receiving elements are divided into four light-receiving element groups of the A phase group, /A phase group, B phase group and /B phase group, so that the four phase signals of A phase 22, B phase 24, /A phase 23 and /B phase 25 are detected with a 90-degree phase difference to each other, and a differential amplification is carried out between the A phase signal 22 and the /A phase signal 23 as well as between the B phase signal 24 and the /B phase signal 25.

In this configuration, a common dummy layer 26 serving as a cross-talk preventive shielding layer is integrally formed in gap spaces between the adjacent light-receiving elements so that light components inputted to the dummy layer 26 are detected as a dummy signal (D) 27. Thus, the dummy layer 26 is served as a shielding member for shielding between the respective adjacent light-receiving elements, so that the light components of the incident light applied to the space between the respective adjacent light-receiving elements can be extracted as the dummy signal 27 to thereby prevent the incident light components from running around the light-receiving elements.

As one example of the configuration, supposing that the average radius r from the center O of the rotary axis of the rotary scale 104 formed in the rotary body 103 is r=9.55 mm, with the number of divisions by the slits of the rotary scale being 500, the average pitch P of the rotary scale is obtained by $2\pi r/500$ which becomes approximately 120 μm. In this case, the gap space between the respective adjacent light-receiving elements becomes P/2 (that is, 60 μm) even in the minimum, which is a sufficient space for forming the dummy layer 26.

In this configuration, since the dummy layer 26 is installed, it is possible to suppress the light components from running around the respective light-receiving elements and also possible to reduce the cross-talk between the adjacent signal components. Moreover, the respective signal components of the A phase signal 22, B phase signal 24, /A phase signal 23 and /B phase signal 25 can be separately detected without overlapping with the wiring for the dummy signal 27.

Moreover, the A phase group and the /A phase group have the same area center of gravity 28 in common on the phase axis, and also the B phase group and the /B phase group have the same area center of gravity 29 in common on the phase axis.

In other words, the area center of gravity of the light-receiving element group of the elements A1, A2, A3 and A4 associated with the A phase 22 is made coincident with the area center of gravity of the light-receiving element group of the elements /A1, /A2, /A3 and /A4 associated with the /A phase 23, sharing the same area center of gravity 28 in common. Also, the area center of gravity of the light-receiving element group of the elements B1, B2, B3 and B4 associated with the B phase 24 is made coincident with the area center of gravity of the light-receiving element group of the elements /B1, /B2, /B3 and /B4 associated with the /B phase, sharing the same area center of gravity 29 in common.

In this manner, since the area centers of gravity on the phase axis of the light-receiving element groups are made coincident with each other, it is possible to stabilize the phase differences in the different plurality of phase signals having predetermined phases different from each other, without any influence even when there is a variation in emission angle of the light source.

Moreover, the phase distance on the phase axis from the center axis line 101 of the irradiation pattern to the area center of gravity 28 of the A phase group and /A phase group is made equal to the phase distance from the center axis line 101 to the area center of gravity 29 of the B phase group and /B phase group.

In this manner, with respect to a plurality of light-receiving element groups having a predetermined phase difference, the area centers of gravity 28 and 29 on the phase axis of the respective light-receiving element groups are arranged symmetrically with respect to the center axis 101 of the irradiation pattern of the incident light emitted from the light source. Therefore, among variations in emission angle of the light source, influences of the axis symmetrical components are eliminated, and thus, it becomes possible to stabilize the phase difference in the different phase signals having a predetermined phase difference.

Figure 5:
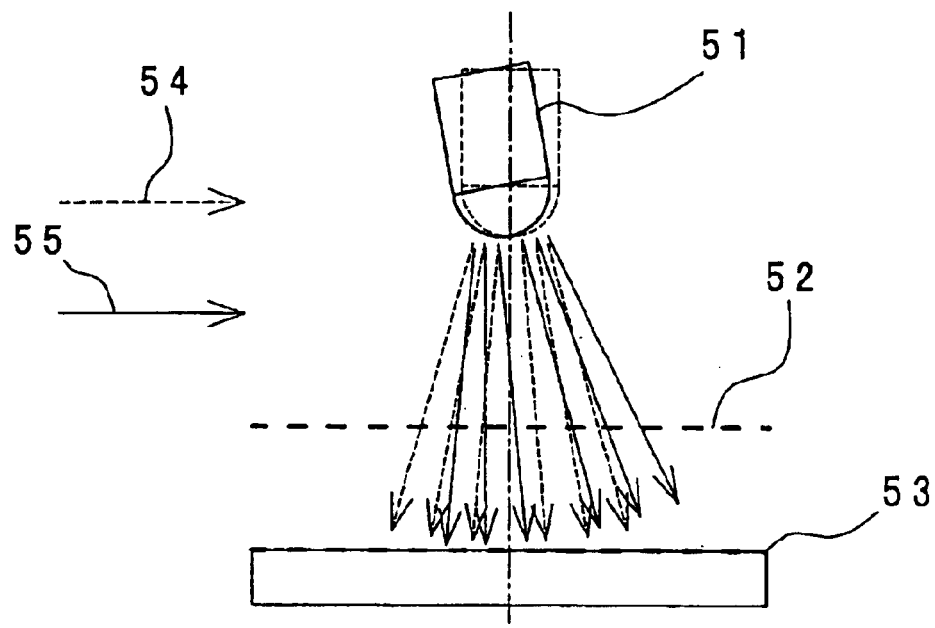
FIG. 5 is an explanatory view showing an example of variation in emission angle of a light source.

FIG. 5 is an explanatory drawing that shows one example of variations in emission angle from a light source. In FIG. 5, reference numeral 51 represents a light source, 52 represents a scale, 53 represents a light-receiving element array, a broken line 54 represents a normal light emission and a solid line 55 represents an erroneous light emission, and this example of variations in emission angle shows a case where a phase error has occurred due to an error in emission angle in a phase difference of 90 degrees obtained by the differential process.

In contrast, as shown in FIG. 2, in the present embodiment 1, the area centers of gravity on the phase axis of respective light-receiving element groups for the A phase 22 and the /A phase 23 are made coincident with each other, sharing the same area center 28 in common. Also, the area centers of gravity for the B phase 24 and the /B phase 25 are made coincident with each other, sharing the same area center 29 in common. Thus, the phase difference in the different plural phase signals having a predetermined phase difference can be stabilized without any influence from variations in emission angle of the light source.

Moreover, the area center of gravity 28 and the area center of gravity 29 are arranged at symmetrical positions with respect to the center axis line 101 of the irradiation pattern. Therefore, it is possible to stabilize the phase difference in the phase signals each having a predetermined phase difference, without any influence from the axis symmetrical components of the variations in emission angle of the light source.

(Embodiment 2)

Figure 3:
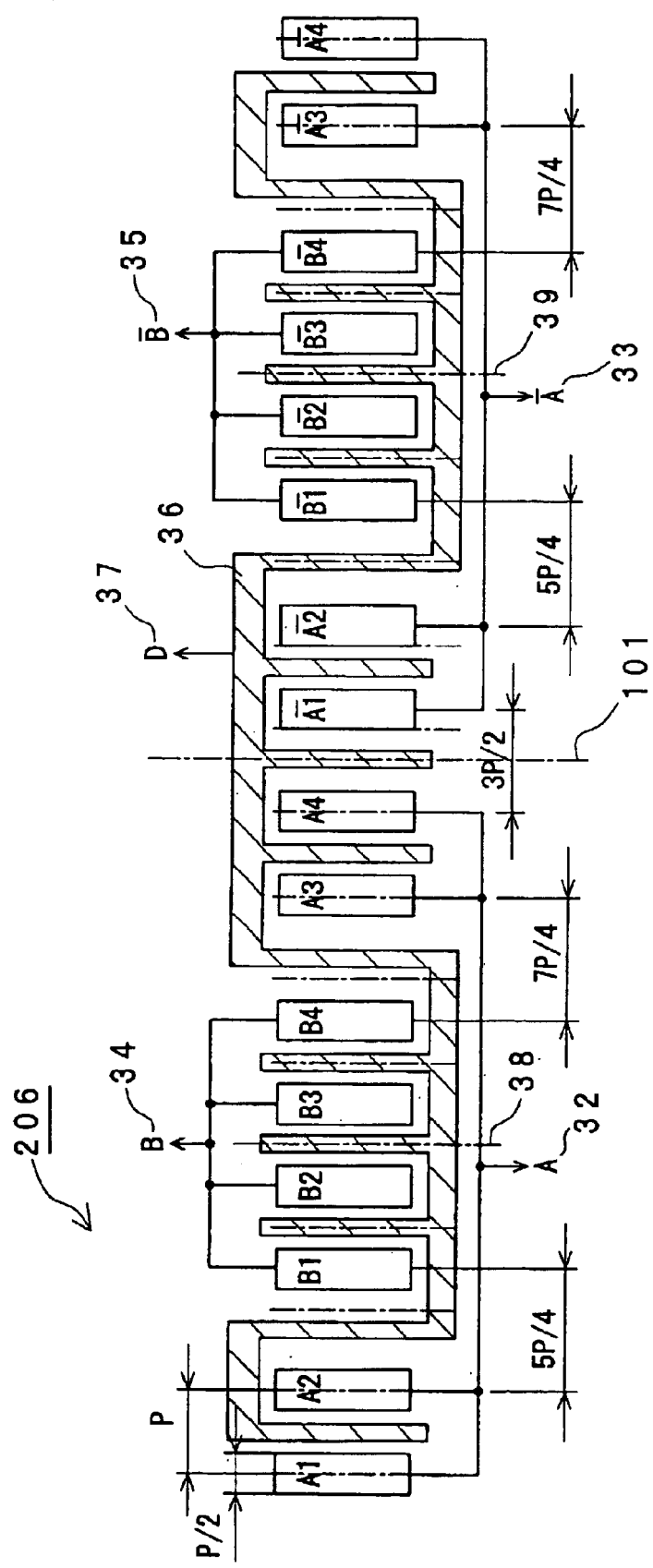
FIG. 3 is an enlarged view of a light-detecting element array arranging light-detecting elements of a photoelectric encoder according to an embodiment 2 of the present invention.

Referring to FIG. 3, the following describes a photoelectric encoder in accordance with an embodiment 2 of the present invention. FIG. 3 is an enlarged view that shows a light-receiving element array 206 in which respective light-receiving elements are arranged on phase basis.

As shown in FIG. 3, in the light-receiving element array 206, regarding a layout of positioning of the respective light-receiving elements, a second light-receiving element A2 of the A phase group for A phase 32 is arranged at a position with a center distance equal to the pitch P from the first light-receiving element A1 for the A phase 32. Next, a first light-receiving element B1 for B phase 34 is arranged at a position with a center distance equal to 5P/4 from the element A2, and the subsequent light-receiving elements B2, B3 and B4 for the B phase are successively arranged at every distance P.

Next, a third light-receiving element A3 for the A phase 32 is arranged at a position with the center distance of 7P/4 from the element B4, and a fourth light-receiving element A4 for the A phase 32 is arranged with the distance P from the third element A3. In the same manner, a first light-receiving element /A1 for the /A phase 33 is arranged at a position with the center distance of 3P/2 from the light-receiving element A4, and a second light-receiving element /A2 for the /A phase is arranged with the distance P from the element /A1. Successively, a first light-receiving element /B1 for the /B phase 35 is arranged at a position with the center distance of 5P/4 from the element /A2, and the subsequent light-receiving elements /B2, /B3 and /B4 for the /B phase 35 are successively arranged at every distance P. Further, a third light-receiving element /A3 for the /A phase 33 is arranged at a position with the center distance of 7P/4 from the element /B4, and a fourth light-receiving element /A4 for the /A phase 33 is arranged with distance P from the element /A3.

Also, in this configuration, similarly to the embodiment 1, a set of four light receiving elements are positioned to have the same phase to form one light-receiving element group in which at least two light receiving elements are adjacently arranged.

In this configuration shown in FIG. 3, the A phase group of the elements A1 to A4 and the B phase group of the elements B1 to B4 share the same area center of gravity 38 in common on the phase axis, and also the /A phase group of the elements /A1 to /A4 and the /B phase group of the elements /B1 to /B4 share the same area center of gravity 39 in common on the phase axis. Thus, the phase distance from the center axis line 101 of the irradiation pattern to the common area center of gravity 38 of the A phase and B phase groups on the phase axis is made approximately equal to the phase distance to the common area center of gravity 39 of the /A phase and /B phase groups.

By using these 16 light-receiving elements, the four phase signals of the A phase 32, /A phase 33, B phase 34 and /B phase 35 are detected with a predetermined phase difference of 90-degrees between the respective adjacent two phases, and a differential amplification is carried out between the complementary A phase 32 and the /A phase 33 as well as between the complementary B phase 34 and the /B phase 35. A common dummy layer 36 serving as a cross-talk preventive shielding layer is arranged in gap spaces between the respective adjacent light-receiving elements so that light components incident to the dummy layer 36 are detected as a dummy signal (D) 37. Thus, the shielding block is provide in the gap spaces between the respective light-receiving elements, and the light components of the incident light once applied to the spaces in the light-receiving elements can be extracted as the dummy signal 37.

In this configuration, since the dummy layer 36 is installed, it is possible to prevent the light components applied to the spaces from running around the respective light-receiving elements and to suppress the cross-talk between the respective adjacent phase signal components. Moreover, the wirings for the respective A phase 32, B phase 34, /A phase 33 and /B phase 35 and the wiring for the dummy signal 37 have no overlapping portion so that the respective signal components can be correctly detected in a separate manner.

Moreover, the phase distance from the center axis line 101 of the irradiation pattern to the common area center of gravity 38 of the A phase 32 and B phase 34 on the phase axis is made approximately equal to the phase distance to the common area center of gravity 39 of the /A phase 33 and /B phase 35. Therefore, it is possible to carry out a stable differential amplifying process without having any influence from external disturbance such as variations in emission angle of the light source.

In this manner, as shown in FIG. 3, with respect to the light-receiving element groups of A phase 32 and /A phase 33 as well as B phase 34 and /B phase 35, the present embodiment 2 makes it possible to reduce the phase error due to an error in emission angle shown in FIG. 5 after the differential process is carried out.

(Embodiment 3)

Figure 4:
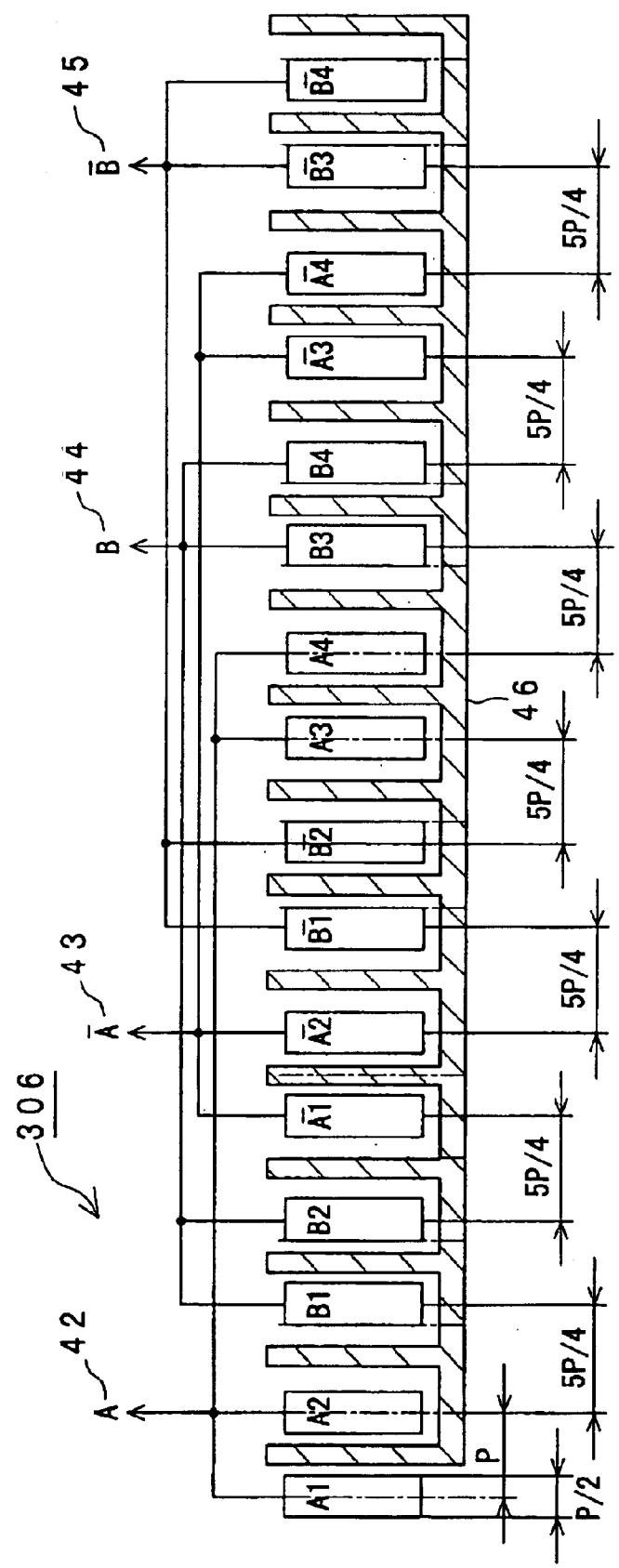
FIG. 4 is an enlarged view of a light-detecting element array arranging light-detecting elements of a photoelectric encoder according to an embodiment 3 of the present invention.

Referring to FIG. 4, the following describes a photoelectric encoder in accordance with the embodiment 3 of the present invention. FIG. 4 is an enlarged view that shows a light-receiving element array in which respective light-receiving elements are arranged on phase basis.

As shown in FIG. 4, in the light-receiving element array 306, regarding a layout of positioning of the respective light-receiving elements, a light-receiving element A1 for the A phase 42 is first provided, and a second light-receiving element A2 for the A phase 42 is arranged at a position with a center distance of the pitch P. Next, a first light-receiving element B1 for the B phase 44 is arranged at a position with a center distance of 5P/4 from the element A2, and subsequently a second light-receiving element B2 for the B phase is arranged with a distance of P from the element B1.

Next, a first light-receiving element /A1 for the /A phase 43 is arranged at a position with a center distance of 5P/4 from the element B2, and subsequently a second light-receiving element /A2 for the /A phase 43 is arranged with a distance P from the element /A1. Similarly, a first light-receiving element /B1 for the /B phase is arranged at a position with a center distance of 5P/4 from the element /A2, and a second light-receiving element /B2 for the /B phase is arranged with a distance P from the element /B1.

In the same manner, a third light-receiving element A3 for the A phase 42 is arranged at a position with a center distance of 5P/4 from the element /B2, and subsequently a fourth light-receiving element A4 is arranged with a distance P from the element A3. Next, a third light-receiving element B3 for the B phase 44 is arranged at a position with a center distance of 5P/4 from the light-receiving element A4, and a fourth light-receiving element B4 for the B phase 44 is arranged with a distance P from the element B3.

Successively, a third light-receiving element /A3 for /A phase is arranged at a position with a center distance of 5P/4 from the element B4, and a fourth light-receiving element /A4 for the /A phase 43 is successively arranged with a distance P from the element /A3. Next, a third light-receiving element /B3 for the /B phase 45 is arranged at a position with a center distance of 5P/4 from the element /A4, and a fourth light-receiving element /B4 for the /B phase 45 is arranged with a distance P from the element /B3. In this manner, in the above-mentioned configuration, the center distance between the light-receiving elements located at the respective ends of adjacent light-emitting element groups, for example, typically indicated by the light-receiving elements A2 and B1, is set to 5P/4.

Also, in this configuration, similarly to the embodiments 1 and 2, a set of four light receiving elements are positioned to have the same phase to form one light-receiving element group in which at least two light receiving elements are adjacently arranged.

By using the 16 light-receiving elements, the four different phase signals of the A phase 42, B phase 44, /A phase 43 and /B phase 45 are detected with a predetermined phase difference of 90 degrees, and a differential amplifying process is carried out between the respective complementary phase signals. A common dummy layer 46 serving as a cross-talk preventive shielding layer is provided in gap spaces between the respective adjacent light-receiving elements so that the light components incident to the dummy layer 46 are detected as a dummy signal (not shown in FIG. 4 but see FIGS. 2 and 3). Thus, the shielding block is provide in the gap spaces between the respective light-receiving elements, and the light components of the incident light applied to the spaces can be extracted as the dummy signal. Thus, in comparison with a case in which the light-receiving elements are arranged one by one at every distance of 5P/4, it becomes possible to reduce the area of the entire light-receiving element array, while properly maintaining the layout of the parallel arrangement provided with the dummy layer.

It is noted that, in the embodiments 1 to 3, although a set of four light receiving elements having the same phase is used to constitute one light-receiving element group, and at least two light receiving elements are adjacently arranged in each of the element groups, the present invention is not limited to this arrangement, and the number of the light-receiving elements included in each element group may be increased or decreased depending on the pitch of the scale and on an irradiation area of the light source.

Moreover, although the width of each of the light-receiving elements for constituting the element group is made equal to P/2, this width may be increased or decreased.

Moreover, as described in the embodiments 1 to 3, it is preferable that the phase differences of the respective light-receiving element groups are set to 0 degree, 90 degrees, 180 degrees and 270 degrees at every 90-degree intervals in view of obtaining two phase signals with a phase difference of 90 degrees by differential amplification of the complementary signals with a phase difference of 180 degrees. However, the present invention is not limited to this relationship, and the phase differences of the respective light-receiving element groups may be set to a value other than 90-degree intervals. For example, eight light-receiving element groups may be formed at every 45-degree intervals in view of obtaining four phase signals with a phase difference of 45 degrees by differential amplification of the complementary signals with a phase difference of 180 degrees, so that the accuracy in phase detection can be improved although the number of the signals is increased.

Moreover, the phase differences of the respective light-receiving element groups may be non-uniform. For example, the phase differences of the respective light-receiving element groups may be set to 90 degrees and 270 degrees. In this arrangement, the phases of the light-receiving element groups may be only two values of 0 degree and 90 degrees in view of obtaining two phase signals with a phase difference of 90 degrees without carrying out a differential amplification although such an arrangement easily has an influence from variations in emission-angle and light intensity of the light source.

Moreover, although four light-receiving element groups having predetermined phase differences are formed in the present invention, other number such as two, three or eight groups may be formed to have predetermined phase differences.

Moreover, although it is preferable that the area centers of gravity (28,29) on the phase axis of a pair of the light-receiving element groups having a predetermined relationship in phase difference are made completely coincident with each other, there may be obtained an effect of stabilizing the phase differences of the plurality of the light-receiving element groups even in the case where the area centers of gravity thereof are generally coincident.

Moreover, as described in the embodiment, it is preferable that the area centers of gravity on the phase axis of a pair of the light-receiving element groups having a predetermined relationship in phase difference are arranged in a completely symmetrical manner in position with respect to a center axis of the emission light distribution pattern. However, there may be obtained an effect of stabilizing the phase differences of the plurality of the light-receiving element groups even in the case where the area centers of gravity thereof are generally symmetrically in position with respect to the center axis.

Figure 6:
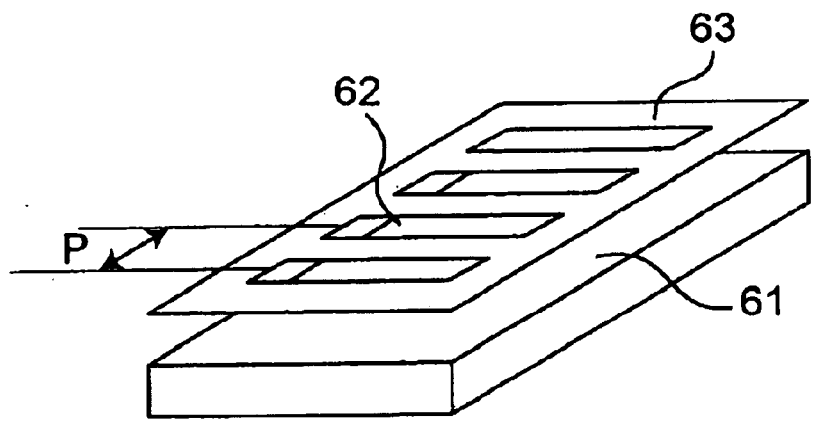
FIG. 6 is a schematic perspective view showing an example of a light-detecting element group.

Moreover, FIG. 6 illustrates an example of one light-receiving element group. As shown in FIG. 6, the light-receiving element group may be formed of a light-receiving element 61 in combination with a light-shielding plate 63. The light-receiving element 61 has a width equal to or larger than a pitch P, and the light-shielding plate 63 has a plurality of light-receiving windows 62 each having a width of P/2. The plurality of light-receiving windows 62 are arranged at every intervals of a pitch P, in other words, arranged with the same phase. In this arrangement, however, the width of the light-receiving window is not limited to P/2, and the width may be increased or decreased than P/2.

Moreover, although the rotary scale having a pitch P with a duty ratio of 50% is used, there may be used other types of scales, so long as a scale is periodically shifted with a pitch P, for example, a scale which is shifted in a sine-wave manner or triangular-wave manner with a pitch P.

Moreover, a light-shielding member, made of, for example, a vapor-deposition film, may be arranged between the respective adjacent light-receiving elements so as to reduce the cross-talk. Moreover, a light-signal blocking means formed by, for example, etching, may be arranged between the respective light-receiving elements so as to reduce the cross-talk.

Moreover, it is noted that, in the above-mentioned embodiments, although a rotary encoder is exemplified as a photoelectric encoder, the present invention is not limited to this, and a linear encoder may be used in the same manner.

As described above, the present invention makes it possible to ensure a space for providing a cross-talk preventive member between the respective light-receiving elements even with a comparatively narrow pitch. Thus, it is possible to prevent the light components of the incident light applied to the spaces from running around the light-receiving elements and to reduce the cross-talk.

Moreover, it is possible to eliminate overlapping of wirings for the plural phase signals and dummy signal, and consequently to easily manufacture a light-receiving element array.

Furthermore, the area centers of gravity of the respective light-receiving element groups between the A phase and the /A phase as well as between the B phase and the /B phase or between the A phase and the B phase as well as between the /A phase and the /B phase are made coincident with each other, and the positions of the respective common area centers of gravity are arranged symmetrically with respect to the center axis line 101 of the irradiation pattern. Thus, it becomes possible to stabilize the phase difference of the respective plural phase signals without having any influence from variations in emission angle of the light source.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A photoelectric encoder for detecting magnitude of movement of an object, the encoder comprising:
   a scale that generates a periodic light-intensity distribution pattern having a pitch P upon irradiation by light emitted from a light source; and
   a plurality of light-detecting segment groups that are shifted relative to said scale to generate phase signals having fixed phase differences from each other so that the magnitude of movement of the object is detected based on the phase signals with the fixed phase differences from each other, wherein
      a plurality of light-detecting segments having the same phase are positioned as each of said plurality of light-detecting segment groups,
      each light-detecting segment group includes at least two of said plurality of light-detecting segments adjacent to each other, and
      said light-detecting segment groups having fixed phase differences have respective area centers of gravity, on a phase axis, that are coincident with each other.

2. The photoelectric encoder according to claim 1, including four of said light-detecting segment groups that respectively correspond to four phase signals, and, when using one of the four phases as a reference phase, the phases of the other three signals are 90°, 180°, and 270°.

3. The photoelectric encoder according to claim 1, wherein width of each light-detecting segment is approximately ½ of the pitch P.

4. A photoelectric encoder for detecting magnitude of movement of an object, the encoder comprising:
   a scale that generates a periodic light-intensity distribution pattern having a pitch P upon irradiation by light emitted from a light source; and
   a plurality of light-detecting segment groups that are shifted relative to said scale to generate phase signals having fixed phase differences from each other so that the magnitude of movement of the object is detected based on the phase signals with the fixed phase differences from each other, wherein
      a plurality of light-detecting segments having the same phase are positioned as each of said plurality of light-detecting segment groups,
      each light-detecting segment group includes at least two of said plurality of light-detecting segments adjacent to each other, and
      said light-detecting segment groups having fixed phase differences have respective area centers of gravity, on a phase axis, that are arranged symmetrically in position with respect to a center axis of the light-intensity distribution pattern.

5. The photoelectric encoder according to claim 4, including four of said light-detecting segment groups that respectively correspond to four phase signals, and, when using one of the four phases as a reference phase, the phases of the other three signals are 90°, 180°, and 270°.

6. The photoelectric encoder according to claim 4, wherein width of each light-detecting segment is approximately ½ of the pitch P.

7. A photoelectric encoder for detecting magnitude of movement of an object, the encoder comprising:
   a scale that generates a periodic light-intensity distribution pattern having a pitch P upon irradiation by light emitted from a light source; and
   a plurality of light-detecting segment groups that are shifted relative to said scale to generate phase signals having fixed phase differences from each other so that the magnitude of movement of the object is detected based on the chase signals with the fixed phase differences from each other, wherein
      a plurality of light-detecting segments having the same phase are positioned as each of said plurality of light-detecting segment groups,
      each light-detecting segment group includes at least two of said plurality of light-detecting segments adjacent to each other,
      a center distance between center positions of the light-detecting segments located adjacent to each other and having the same phase is equal to the pitch P, and
      a center distance between center positions of the light-detecting segments located adjacent to each other and located at the respective ends of different light-emitting segment groups having different phases is equal to 5P/4.

8. The photoelectric encoder according to claim 7, including four of said light-detecting segment groups that respectively correspond to four phase signals, and, when using one of the four phases as a reference phase, the phases of the other three signals are 90°, 180°, and 270°.

9. The photoelectric encoder according to claim 7, wherein width of each light-detecting segment is approximately ½ of the pitch P.

10. A photoelectric encoder for detecting magnitude of movement of an object, the encoder comprising:
   a scale that generates a periodic light-intensity distribution pattern having a pitch P upon irradiation by light emitted from a light source;
   a plurality of light-detecting segment groups that are shifted relative to said scale to generate phase signals having fixed phase differences from each other so that the magnitude of movement of the object is detected based on the phase signals with the fixed phase differences from each other, wherein
      a plurality of light-detecting segments having the same phase are positioned as each of said plurality of light-detecting segment groups, and
      each light-detecting segment group includes at least two of said plurality of light-detecting segments adjacent to each other; and
   a cross-talk preventing portion in said light-detecting segment groups, integrally located in spaces between respective light-detecting segments located adjacent to each other.

11. The photoelectric encoder according to claim 10, wherein said cross-talk preventing portion is a vapor-deposited film member.

12. The photoelectric encoder according to claim 10, wherein said cross-talk preventing portion is an etched signal-light shielding member.

13. The photoelectric encoder according to claim 10, including four of said light-detecting segment groups that respectively correspond to four phase signals, and, when using one of the four phases as a reference phase, the phases of the other three signals are 90°, 180°, and 270°.

14. The photoelectric encoder according to claim 10, wherein width of each light-detecting segment is approximately ½ of the pitch P.

* * * * *